United States Patent
Iwamuro et al.

(10) Patent No.: US 10,263,105 B2
(45) Date of Patent: Apr. 16, 2019

(54) HIGH VOLTAGE SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Noriyuki Iwamuro, Tsukuba (JP); Shinsuke Harada, Tsukuba (JP)

(73) Assignees: FUJI ELECTRIC CO., LTD., Kawasaki-Shi, Kanagawa (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 73 days.

(21) Appl. No.: 15/018,161

(22) Filed: Feb. 8, 2016

(65) Prior Publication Data
US 2016/0155836 A1    Jun. 2, 2016

Related U.S. Application Data

(63) Continuation of application No. PCT/JP2014/068633, filed on Jul. 11, 2014.

(30) Foreign Application Priority Data

Aug. 8, 2013 (JP) ................................. 2013-165624

(51) Int. Cl.
*H01L 21/04* (2006.01)
*H01L 29/04* (2006.01)
(Continued)

(52) U.S. Cl.
CPC ........ *H01L 29/7802* (2013.01); *H01L 21/046* (2013.01); *H01L 29/045* (2013.01);
(Continued)

(58) Field of Classification Search
CPC ........... H01L 29/1608; H01L 29/66068; H01L 29/1095; H01L 29/7802
(Continued)

(56) References Cited

U.S. PATENT DOCUMENTS 6,117,735 A    9/2000 Ueno
6,455,892 B1 * 9/2002 Okuno .............. H01L 29/66068
                                                          257/328
(Continued)

FOREIGN PATENT DOCUMENTS

JP    H11-195655 A    7/1999
JP    2002-270839       9/2002
(Continued)

OTHER PUBLICATIONS

Tatsuhiko Fujihira, "Theory of Semiconductor Superjunction Devices", Jpn. J. Appl. Phys. vol. 36, pp. 6254-6262, Part 1, No. 10, Oct. 1997.
(Continued)

*Primary Examiner* — Nduka E Ojeh
(74) *Attorney, Agent, or Firm* — Rabin & Berdo, P.C.

(57) ABSTRACT

In an embodiment, on an n⁻-type SiC layer on an n⁺-type SiC semiconductor substrate and a p⁺ layer selectively formed on the n⁻-type SiC layer, a p base layer is formed on which, a p⁺ contact layer is selectively formed. From a surface, an n counter layer penetrates the p base layer to the n⁻-type SiC layer. A gate electrode layer is disposed via a gate insulating film, on an exposed surface of the p base layer between the p⁺ contact layer and the n counter layer; and a source electrode contacts the p⁺ contact layer and the p base layer. In a back surface, a drain electrode is disposed. A portion of
(Continued)

the p+ layers are joined at a region of a drain electrode side of the n counter layer, by a joining unit and a p+ layer contacts a drain electrode side of the p+ layer.

17 Claims, 13 Drawing Sheets

(51) Int. Cl.
| | |
|---|---|
| *H01L 29/06* | (2006.01) |
| *H01L 29/08* | (2006.01) |
| *H01L 29/10* | (2006.01) |
| *H01L 29/12* | (2006.01) |
| *H01L 29/16* | (2006.01) |
| *H01L 29/66* | (2006.01) |
| *H01L 29/78* | (2006.01) |
| *H01L 29/739* | (2006.01) |
| *H01L 29/15* | (2006.01) |
| *H01L 31/0312* | (2006.01) |

(52) U.S. Cl.
CPC ........ *H01L 29/063* (2013.01); *H01L 29/0623* (2013.01); *H01L 29/0696* (2013.01); *H01L 29/1095* (2013.01); *H01L 29/12* (2013.01); *H01L 29/1608* (2013.01); *H01L 29/66068* (2013.01); *H01L 29/7395* (2013.01); *H01L 29/0878* (2013.01)

(58) Field of Classification Search
USPC .............. 257/E29.104, 77, E29.262, E21.41; 438/268, 212, 199
See application file for complete search history.

(56) References Cited

U.S. PATENT DOCUMENTS

| | | | |
|---|---|---|---|
| 6,576,929 B2 * | 6/2003 | Kumar | H01L 29/66068 257/289 |
| 7,923,320 B2 | 4/2011 | Ryu | |
| 2002/0185679 A1 * | 12/2002 | Baliga | H01L 21/823487 257/329 |
| 2006/0057796 A1 * | 3/2006 | Harada | H01L 21/0465 438/199 |
| 2009/0096020 A1 * | 4/2009 | Yamanobe | H01L 29/0619 257/337 |
| 2009/0134404 A1 * | 5/2009 | Sugimoto | H01L 21/0445 257/77 |
| 2013/0032822 A1 * | 2/2013 | Ishibashi | H01L 21/02002 257/77 |

FOREIGN PATENT DOCUMENTS

| | | |
|---|---|---|
| JP | 2009-094314 A | 4/2009 |
| JP | 2009-099714 A | 5/2009 |
| JP | 2011-258635 A | 12/2011 |
| WO | WO-2004/036655 A1 | 4/2004 |

OTHER PUBLICATIONS

G. Deboy et al., "A new generation of high voltage MOSFETs breaks the limit line of silicon", International Electron Devices Meeting, IEDM 98-683, IEEE Technical Digest, Dec. 6-9, 1998, pp. 683-685.

Krishna Shenai et al., "Optimum Semiconductors for High-Power Electronics", IEEE Transactions on Electron Devices, vol. 36, No. 9, Sep. 1989, pp. 1811-1823.

* cited by examiner

AT P+ IMPLANT LAYER, P+ IMPLANT LAYER CONNECTED BELOW P CHANNEL (EPITAXIAL) LAYER

FIG.9

PRESENT INVENTION

| | FIRST EMBODIMENT | SECOND EMBODIMENT | THIRD EMBODIMENT | FORTH EMBODIMENT | FIFTH EMBODIMENT | SIXTH EMBODIMENT | SEVENTH EMBODIMENT |
|---|---|---|---|---|---|---|---|
| BREAKDOWN VOLTAGE (RT) | 1450V | 1452V | 1453V | 1455V | -1430V | -1438V | -1430V |
| ON RESISTIVITY (RT) | 3.2mΩcm² | 3.2mΩcm² | 3.6mΩcm² | 3.5mΩcm² | 5.2mΩcm² | 5.1mΩcm² | 5.9mΩcm² |
| TURN-OFF LOSS (150°C) | 0.85mJ | 0.86mJ | 0.85mJ | 0.89mJ | 0.89mJ | 0.84mJ | 0.89mJ |
| TURN-ON LOSS (150°C) | 0.90mJ | 0.98mJ | 0.92mJ | 0.90mJ | 0.90mJ | 0.91mJ | 0.90mJ |
| GATE THRESHOLD (175°C) | 3.2V | 3.2V | 3.3V | 3.2V | 3.7V | 3.6V | 3.6V |
| TURN-OFF CAPABILITY (175°C) | >100A | >100A | >100A | >100A | >100A | >100A | >100A |
| SHORT CIRCUIT CAPABILITY (175°C) | >15μs | >15μs | >15μs | >15μs | >15μs | >15μs | >15μs |

PRESENT INVENTION | CONVENTIONAL TECHNIQUE

| | EIGHTH EMBODIMENT | NINTH EMBODIMENT | TENTH EMBODIMENT | CONVENTIONAL n-SiC MOSFET | CONVENTIONAL p-SiC MOSFET | Si-IGBT |
|---|---|---|---|---|---|---|
| BREAKDOWN VOLTAGE (RT) | -1440V | 1452V | -1440V | 1420V | -1250V | 1448V |
| ON RESISTIVITY (RT) | 5.9mΩcm² | 3.6mΩcm² | 6.4mΩcm² | 6.9mΩcm² | 10.8mΩcm² | 11.2mΩcm² |
| TURN-OFF LOSS (150°C) | 0.89mJ | 0.86mJ | 0.89mJ | 0.89mJ | 0.89mJ | 2.10mJ |
| TURN-ON LOSS (150°C) | 0.90mJ | 0.98mJ | 0.90mJ | 0.98mJ | 0.98mJ | 3.10mJ |
| GATE THRESHOLD (175°C) | 3.5V | 3.2V | 3.4V | 3.2V | 3.2V | 3.9V |
| TURN-OFF CAPABILITY (175°C) | >100A | >100A | >100A | >100A | 82A | >100A |
| SHORT CIRCUIT CAPABILITY (175°C) | >15μs | >15μs | >15μs | >15μs | 5.2μs | 4.8μs |

HIGH VOLTAGE SEMICONDUCTOR DEVICE

CROSS REFERENCE TO RELATED APPLICATIONS

This is a continuation application of International Application PCT/JP2014/068633 filed on Jul. 11, 2014 which claims priority from a Japanese Patent Application No. 2013-165624 filed on Aug. 8, 2013, the contents of which are incorporated herein by reference.

BACKGROUND OF THE INVENTION

1. Field of the Invention

The present invention relates to a high voltage power semiconductor device that can control high current and particularly relates to a vertical high voltage semiconductor device that uses silicon carbide, which is a wide bandgap material, as a semiconductor and a manufacturing method of the vertical high voltage semiconductor device.

2. Description of the Related Art

Conventionally, single crystal silicon has been used as a material for high voltage semiconductor devices that control high current. At present, there are various types of power semiconductor devices and each is selectively used according to intended purpose. For example, bipolar transistors and insulated gate bipolar transistors (IGBT), which can handle high current density, cannot switch at high speeds and the application limit for bipolar transistors is a frequency of several kHz and for IGBTs, a frequency on the order of 20 kHz.

On the other hand, power MOSFETs, which cannot handle high current, can be used for switching at the high speeds up to a frequency of a few MHz. Nonetheless, market demand for power devices equipped to handle both high current and high speeds is strong and much effort has been poured into the improvement of IGBTs and power MOSFETs, to the point that at present, the performance of power devices has substantially reached the theoretical limit determined by the material.

FIG. 17 is a cross-sectional view of a conventional MOSFET. An $n^-$ drift layer 2 is formed stacked on an $n^+$-type semiconductor substrate 1. In a surface layer of the $n^-$ drift layer 2, a p base layer 4 is selectively formed. In a surface layer of the p base layer 4, an $n^+$ source layer 7 is selectively formed; and a gate electrode 8 is formed via a gate insulating film on the $n^-$ drift layer 2, the p base layer 4, and the $n^+$ source layer 7. Recently, a MOSFET (hereinafter, superjunction MOSFET) that uses parallel pn layers of p-type regions and n-type regions of high impurity concentrations, in an alternating arrangement, as a drift layer has received much attention.

FIG. 18 is a cross-sectional view of a conventional silicon superjunction MOSFET. Further, FIG. 19 is a cross-sectional view of a silicon superjunction MOSFET by a conventional multi epitaxial growth method. FIG. 20 is a cross-sectional view of a silicon superjunction MOSFET by a conventional trench filling method.

These superjunction MOSFETs were presented in a research paper by Fujihira, et al in 1997 (refer to Fujihira, Tatsuhiko, "Theory of Semiconductor Superjunction Devices", Jpn. J. Appl. Phys, Vol. 36, pp. 6254-6262, Part 1, No. 10, October 1997) and were produced in 1998 by Deboy, et al as "CoolMOS" (refer to Deboy, G., et al, "A new generation of high voltage MOSFETs breaks the limit line of silicon", IEEE IEDM pp. 683-685, 1998). These superjunction MOSFETs are characterized in being formed in a pillar structure having a p layer in a vertical direction (in a direction of substrate depth) in an $n^-$ drift layer, enabling ON resistance to be dramatically improved without degrading breakdown voltage.

Further, material studies have been performed from the perspective of power semiconductor devices and as reported by Shenai, et al (refer to SHENAI, KRISHNA, et al, "Optimum Semiconductors for High-Power Electronics", IEEE TRANSACTIONS ON ELECTRON DEVICES, vol. 36, p. 1811-1823, 1989), recently, silicon carbide (SiC) in particular has gathered attention for use in devices having low ON voltage with excellent high-speed and temperature properties, as next generation power semiconductor devices. SiC is a very stable material chemically, has a wide bandgap of 3 eV, and can be used very stably as a semiconductor even at high temperatures. Further, the critical electric field strength of SiC is 10-fold that of silicon or higher. The material performance of SiC is likely to exceed the material performance limits of silicon and therefore, increased use of SiC for power semiconductors is greatly expected, especially for MOSFETs. In particular, there are high expectations related to the low ON-resistance of SiC and for a vertical SiC-MOSFET that has even lower ON-resistance, while maintaining high breakdown voltage.

The cross-sectional structure of a typical SiC-MOSFET is that depicted in FIG. 17 described above, similar to silicon. In the surface layer of the $n^-$ drift layer 2, the p base layer 4 is selectively formed. The $n^+$ source layer 7 selectively formed in the surface layer of the p base layer 4 is formed; the gate electrode 8 is formed on the $n^-$ drift layer 2, the p base layer 4, and the $n^+$ source layer 7, via the gate insulating film; and a drain electrode 11 is formed in the back surface of the semiconductor substrate 1.

A SiC-MOSFET thus formed is expected to be used as a device capable of high speed switching while having a low ON-resistance such as in a power conversion equipment like a motor control inverter or an uninterruptible power supply (UPS).

SiC is a wide bandgap semiconductor material and therefore, the critical electric field strength thereof is about 10 times higher than that of Si and the ON-resistance of SiC is expected to be sufficiently low. However, because the critical electric field strength of the semiconductor is about 10 times higher than that of Si, the electric field load on the oxide film becomes higher compared to that of a Si device especially when high voltage is applied.

Consequently, for silicon power devices, the critical electric field strength of Si is reached before a high electric field is applied to the oxide film and therefore, is not problematic. However, with a power device that uses SiC, there is concern that the oxide film will fail. For example, high electric field strength is applied to the gate insulating film (oxide film) of the SiC-MOSFET depicted in FIG. 17, potentially arising in a serious problem concerning the reliability of the SiC-MOSFET. This concerns not only SiC-MOSFETs but also SiC-IGBTs. Regarding this, for example, a document describes that care needs to be taken in terms of the electric field strength applied to the gate oxide film in the SiC-MOSFET (refer to U.S. Pat. No. 7,923,320).

SUMMARY OF THE INVENTION

To achieve one object, a high voltage semiconductor device of the present invention includes a first conductivity type semiconductor substrate; a first conductivity type semiconductor layer formed on the first conductivity type semiconductor substrate and of an impurity concentration lower than that of the first conductivity type semiconductor substrate; a second conductivity type high-concentration semiconductor layer of a high concentration and selectively in a surface of the first conductivity type semiconductor layer; a second conductivity type low-concentration semiconductor layer of a concentration lower than that of the second conductivity type high-concentration semiconductor layer and formed on the first conductivity type semiconductor layer and the second conductivity type high-concentration semiconductor layer; a first conductivity type source region selectively formed in a surface layer of the second conductivity type low-concentration semiconductor layer; a first conductivity type well region formed from a surface of the second conductivity type low-concentration semiconductor layer and penetrating the second conductivity type low-concentration semiconductor layer to reach the first conductivity type semiconductor layer; a gate electrode layer disposed via a gate insulating film, on an exposed surface portion of the second conductivity type low-concentration semiconductor layer between the first conductivity type source region and the first conductivity type well region; a source electrode that contacts the first conductivity type source region and the second conductivity type low-concentration semiconductor layer; and a drain electrode disposed in a back surface of the first conductivity type semiconductor substrate. The high voltage semiconductor device is a vertical type, and the second conductivity type high-concentration semiconductor layer is partially joined to an adjacent second conductivity type high-concentration semiconductor layer, at a region of a drain electrode side of the first conductivity type well region and has a second conductivity type high-concentration region formed to contact a drain electrode side of the second conductivity type high-concentration semiconductor layer.

The high voltage semiconductor device further includes a trench that penetrates the second conductivity type low-concentration semiconductor layer and the second conductivity type high-concentration semiconductor layer from a front surface side and reaches the second conductivity type high-concentration region. The source electrode is disposed to be embedded inside the trench.

In the high voltage semiconductor device, a material of the first conductivity type semiconductor substrate is silicon carbide.

In the high voltage semiconductor device, a crystallographic plane index of the first conductivity type semiconductor substrate is a plane that is any one among parallel to (000-1) and tilted within 10 degrees with respect to (000-1).

In the high voltage semiconductor device, a crystallographic plane index of the first conductivity type semiconductor substrate is a plane that is any one among to parallel to (0001) and tilted within 10 degrees with respect (0001).

A manufacturing method of a high voltage semiconductor device of the present disclosure includes epitaxially growing on a first conductivity type semiconductor substrate, a first conductivity type semiconductor layer of a concentration that is lower than that of the first conductivity type semiconductor substrate; selectively forming by ion implantation, a second conductivity type high-concentration region in a surface layer of the first conductivity type semiconductor layer; forming by ion implantation, a second conductivity type high-concentration semiconductor layer at a depth shallower than the second conductivity type high-concentration region, in a surface layer of the first conductivity type semiconductor layer and to contact the second conductivity type high-concentration region; forming by epitaxial growth, a second conductivity type low-concentration semiconductor layer on the first conductivity type semiconductor layer and the second conductivity type high-concentration semiconductor layer; and selectively forming a first conductivity type source region in a surface layer of the second conductivity type low-concentration semiconductor layer and a first conductivity type well region that penetrates the second conductivity type low-concentration semiconductor layer from a front surface and reaches the first conductivity type semiconductor layer, by ion implantation. The forming by ion implantation, the second conductivity type high-concentration region includes forming the second conductivity type high-concentration semiconductor layer such that a portion of the second conductivity type high-concentration semiconductor layer is partially joined at a region below the first conductivity type well region.

In the manufacturing method of a high voltage semiconductor device, the selectively forming by ion implantation, the second conductivity type high-concentration region in the surface layer includes forming a trench from a surface of the first conductivity type semiconductor layer and the second conductivity type high-concentration region is formed in a bottom surface of the trench by ion implantation.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 9 is a chart of measurement results of electrical characteristics of the SiC-MOSFET of each embodiment;

DETAILED DESCRIPTION OF THE PREFERRED EMBODIMENTS

Embodiments

Figure 1:
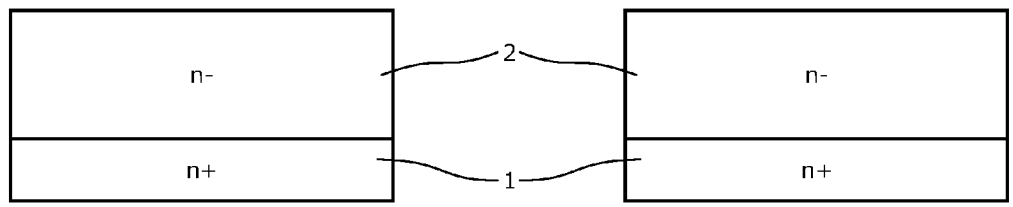
FIG. 1 is a cross-sectional view (part 1) during SiC-MOSFET manufacturing processes according to a first embodiment.

Preferred embodiments of a high voltage semiconductor device and a manufacturing method thereof according to the present disclosure will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. When Miller indices are described, "−" means a bar added to an index immediately after the "−", and a negative index is expressed by prefixing "−" to the index. In the description of the embodiments below and the accompanying drawings, identical constituent elements will be given the same reference numerals and will not repeatedly be described.

First Embodiment

A first embodiment of the present disclosure will be described with reference to the drawings. FIGS. 1, 2, 3, 4, 5, 6, and 7 are cross-sectional views during SiC-MOSFET manufacturing processes according to the first embodiment. In each drawing, (a) represents a cross section of a portion not joined to a p$^+$ layer 3 and (b) represents a cross section of a portion joined to the p$^+$ layer 3. In the first embodiment of the present disclosure, a 1200V MOSFET using silicon carbide as a semiconductor material is represented as a vertical planar gate MOSFET.

As depicted in FIG. 1, an n$^+$-type SiC semiconductor substrate 1 is prepared. Here, the n$^+$-type SiC semiconductor substrate 1 of low resistivity includes about $2\times10^{19}$ cm$^{-3}$ of nitrogen as an impurity. On a surface of the n$^+$-type SiC semiconductor substrate 1, tilted about 4 degrees with respect to the crystallographic plane index (000-1), an n$^-$-type SiC layer 2 of about 10 μm and including about $1.0\times10^{16}$ cm$^{-3}$ of nitrogen is epitaxially grown.

Figure 2:
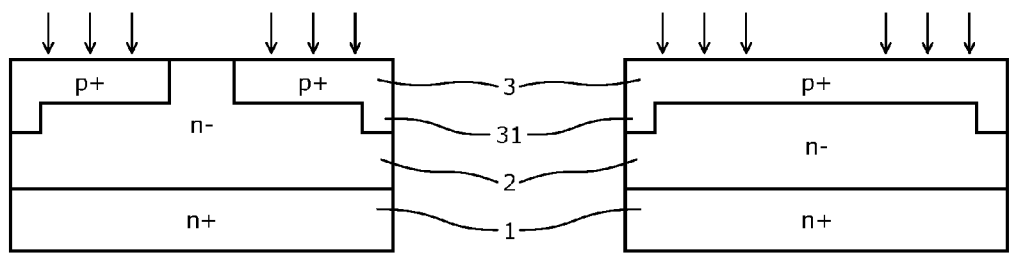
FIG. 2 is a cross-sectional view (part 2) during SiC-MOSFET manufacturing processes according to the first embodiment.

Next, as depicted in FIG. 2, in a surface layer of the n$^-$-type SiC layer 2, an p$^+$ layer 31 of a width of 2 μm and a depth of 0.3 μm is selectively formed by an ion implantation method. Thereafter, acceleration energy is reduced and a p$^+$ layer 3 of a width of 13 μm and a depth of 0.5 μm is formed by an ion implantation method. Here, the ion used is aluminum. Further, the p$^+$ layer 31 is disposed in a center of the p$^+$ layer 3. A dosing volume is set such that the impurity concentration of the p$^+$ layer 31 and the p$^+$ layer 3 becomes $1.0\times10^{18}$ cm$^{-3}$.

Here, below (drain electrode side) an n counter layer 6 formed at a later process, a portion of the p$^+$ layers 3 are mutually joined by a joining unit 13 (refer to FIGS. 8A and 8B).

Figure 3:
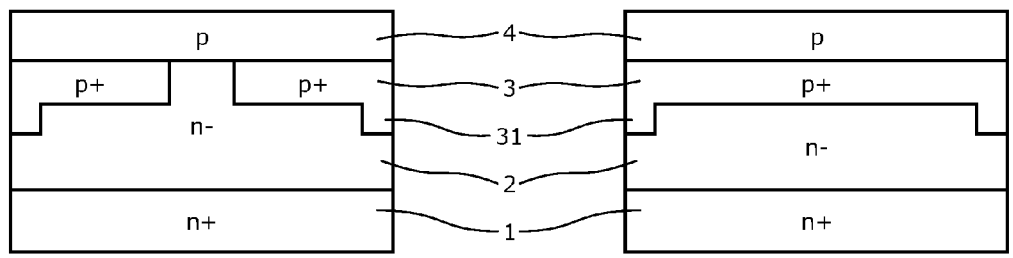
FIG. 3 is a cross-sectional view (part 3) during SiC-MOSFET manufacturing processes according to the first embodiment.

Thereafter, as depicted in FIG. 3, a p base layer 4 of a thickness of 0.5 μm is formed by an epitaxial growth method on the p$^+$ layer 3 and the n$^-$-type SiC layer 2. Here, the impurity is aluminum and the impurity concentration is set to become $5.0\times10^{16}$ cm$^{-3}$.

Figure 4:
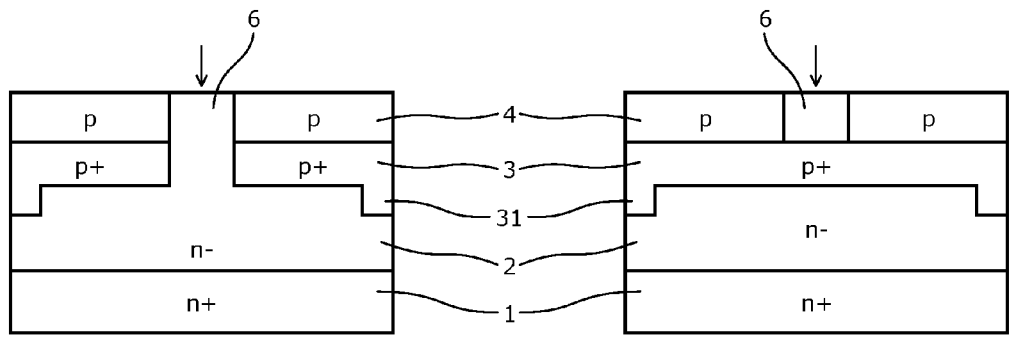
FIG. 4 is a cross-sectional view (part 4) during SiC-MOSFET manufacturing processes according to the first embodiment.

Thereafter, as depicted in FIG. 4, $5.0\times10^{16}$ cm$^{-3}$ of nitrogen ions are selectively implanted by ion implantation to a depth of 1.5 μm and a width of 2.0 μm to be the n counter layer 6, which counters a portion of the p base layer 4 by the n-type.

Figure 5:
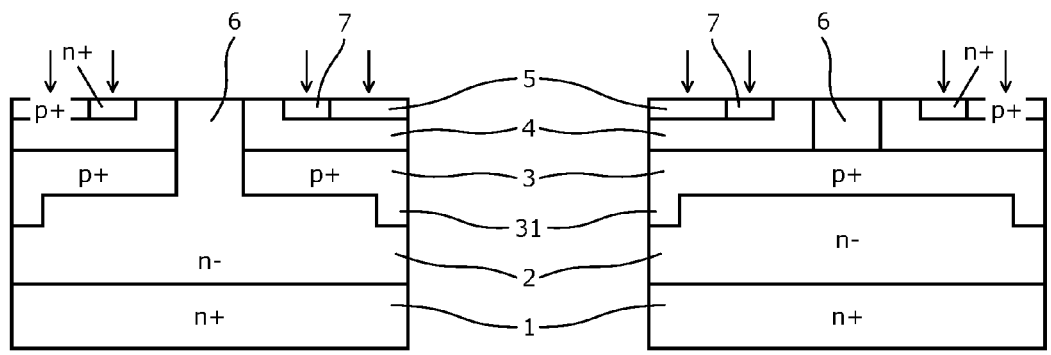
FIG. 5 is a cross-sectional view (part 5) during SiC-MOSFET manufacturing processes according to the first embodiment.

Thereafter, as depicted in FIG. 5, an n$^+$ source layer 7 and p$^+$ contact layer 5 are selectively formed inside the p base layer 4. Thereafter, activation annealing is performed. Heat treatment temperature and duration are 1800 degrees C. and 2 minutes.

Figure 6:
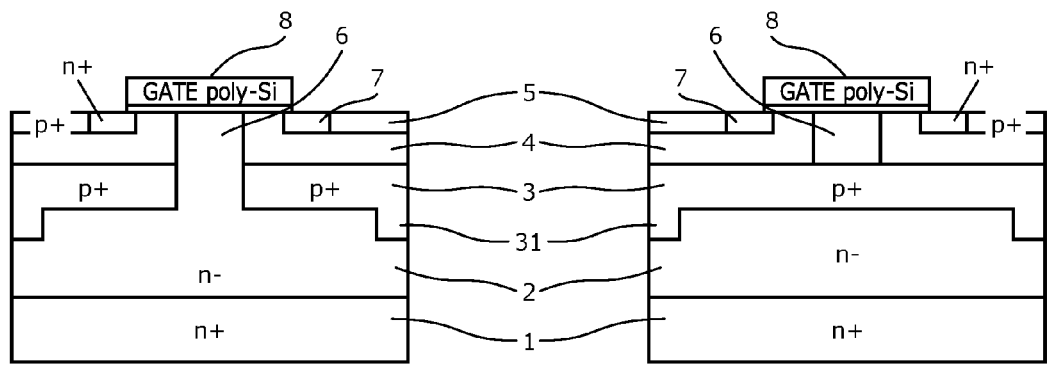
FIG. 6 is a cross-sectional view (part 6) during SiC-MOSFET manufacturing processes according to the first embodiment.

Thereafter, as depicted in FIG. 6, a gate oxide film of a thickness of 100 nm is formed by thermal oxidation and annealing is performed in a hydrogen atmosphere around 1000 degrees C. A polycrystalline silicon layer doped with phosphorus is formed as a gate electrode 8 and patterning is performed.

Figure 7:
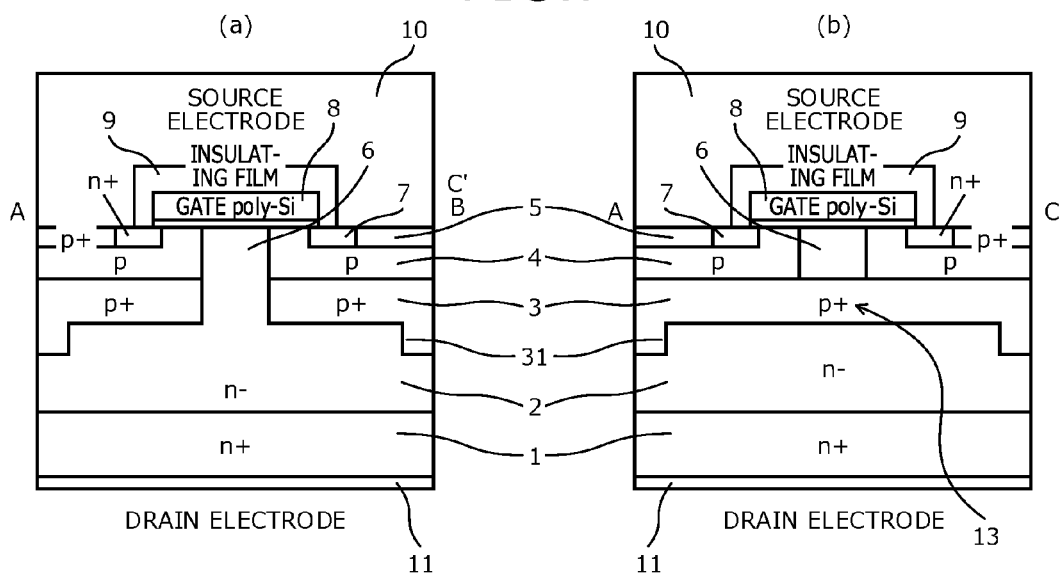
FIG. 7 is a cross-sectional view (part 7) during SiC-MOSFET manufacturing processes according to the first embodiment.

Thereafter, as depicted in FIG. 7, as an interlayer insulating film 9, a film of phosphorous glass of a thickness of 1.0 μm is formed; after patterning, heat treatment is performed; a film of aluminum including 1% silicon and having a thickness of 5 μm is formed on the surface by a sputtering method; and a source electrode 10 contacting surfaces of both the p$^+$ contact layer 5 and the n$^+$ source layer 7 is provided. Finally, a nickel film is formed on a device back surface and after heat treatment at 970 degrees C., sequentially Ti/Ni/Au films are formed as a back surface electrode (drain electrode) 11. A protection film is added to the surface on the source electrode 10 side, completing manufacture of the device.

Figure 8A:
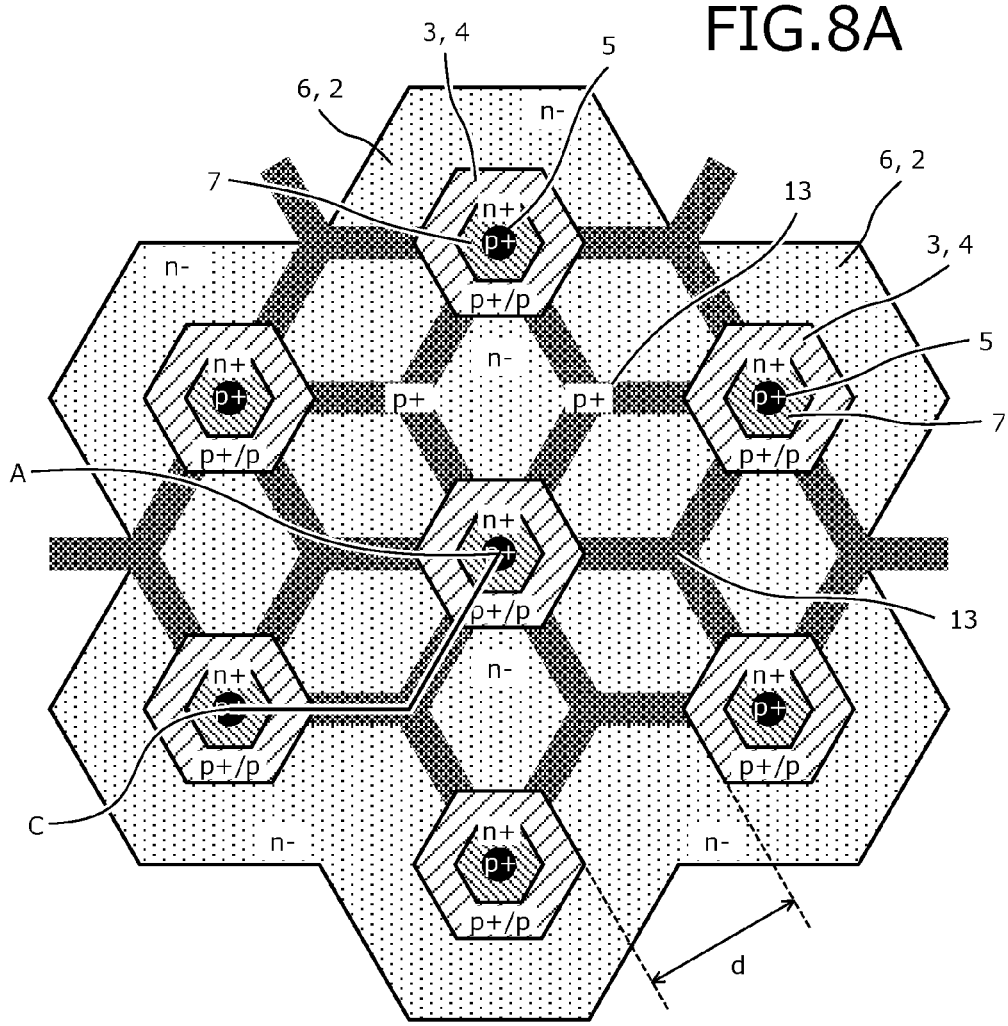
FIG. 8A is a plan view of $p^+$ layer and cell layout of the SiC-MOSFET according to the first embodiment of the present disclosure.
Figure 8B:
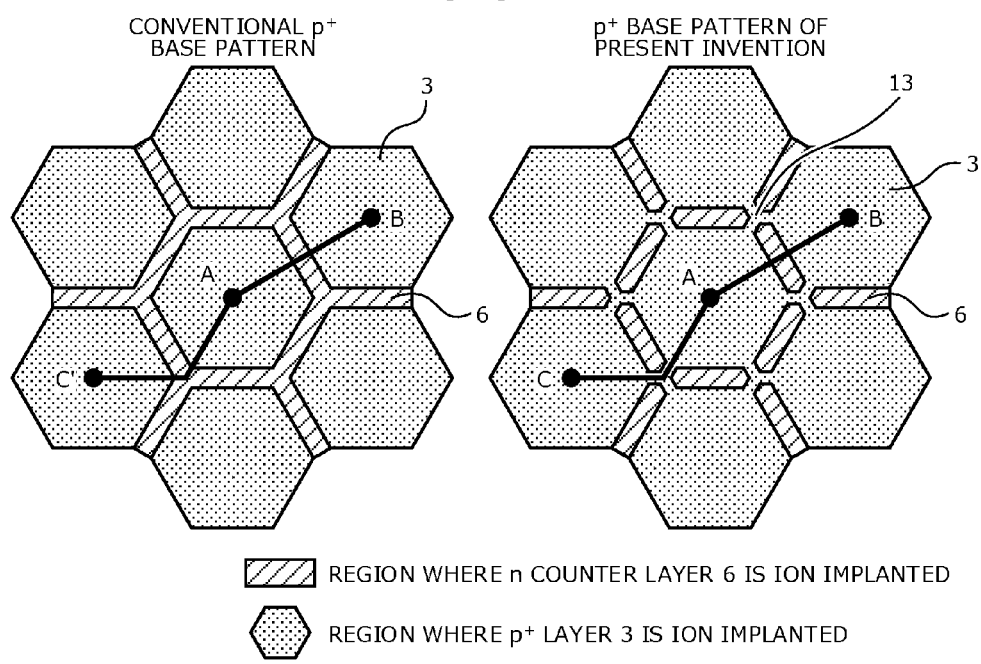
FIG. 8B is a plan view depicting comparison of plan views of $p^+$ layer and cell layout of the SiC-MOSFET according to the first embodiment of the present disclosure and a conventional plan view.

FIG. 8A is a plan view of p$^+$ layer and cell layout of the SiC-MOSFET according to the first embodiment of the present disclosure. FIG. 8B is a plan view depicting comparison of plan views of p$^+$ layer and cell layout of the SiC-MOSFET according to the first embodiment of the present disclosure and a conventional plan view. In FIG. 8A, the source electrode, gate electrode, and gate oxide film are not depicted. At the p$^+$ layers 3, the p$^+$ layers 3 beneath the p base layer 4 are connected by the joining unit 13. FIG. 8B a base pattern of the p$^+$ layers 3. In the present embodiment, although the p$^+$ layers 3 are produced in a hexagonal cell pattern, the p$^+$ layers 3 may be another polygonal shape such as a quadrilateral cell, etc. Further, a distance between the p$^+$ layers 3 of portions not mutually joined is 2 μm.

According to the configuration above, even when the impurity concentration of the n$^-$-type SiC layer 2 and the n-type semiconductor cell region (n counter layer) 6 is greatly increased and the ON resistance is lowered sufficiently, or the distance between the p$^+$ layers 3 and between the p base layers 4 is increased and the ON resistance is lowered sufficiently, and even when high voltage is applied between the source and drain (0V is applied to the source and +voltage is applied to the drain), irrespective of a high electric field at the gate oxide film on the n-type semiconductor cell region (n counter layer) 6, sufficient breakdown voltage can be maintained. Further, even in a state where high voltage, high current, etc. under short circuit conditions are concurrently applied to/conducted by the device, electric field strength is mitigated and therefore, high breakdown voltage can be shown. This is consequent to a depletion layer that spreads from a pn junction between the n-type semiconductor cell region 6 and the p base layer 4 and the $p^+$ layer 3, to the n-type semiconductor cell region 6, being susceptible to spreading along the $p^+$ layer 3 in a horizontal direction. As a result, even when the impurity concentration of the $n^-$-type SiC layer 2 and the n counter layer 6 is set to be higher than a conventional MOSFET, the design facilitates spreading of the depletion layer and therefore, the distance between the $p^+$ layers 3 and between the p base layers 4 is increased, enabling the breakdown voltage and breakdown tolerance to be sufficiently held while reducing the ON resistance.

When the p base layer 4 of the present disclosure is formed by an epitaxial growth method, a flat surface with substantially no surface roughness can be achieved and therefore, the mobility of the MOSFET portion of the surface becomes extremely large and as a result, the ON resistance can be further reduced.

FIG. 9 is a chart of measurement results of electrical characteristics of the SiC-MOSFET of each embodiment (1200V/25 A device). The chip size in the first embodiment is 3 mm square; the area of an active region is 5.27=$^2$; and the rated current is 25 A. The active region is a region in which current flows during an ON state. In the first embodiment, concerning the breakdown voltage and ON resistance at room temperature (RT), the ON resistance (RonA) is shown to be a sufficiently low value of 3.2 mΩ cm$^2$ and the initial breakdown voltage is a 1450V and is also shown to be a sufficiently favorable characteristic for a 1200V device. For comparison, a SiC-MOSFET (refer to FIG. 8B) produced without any joining of the $p^+$ layers 3 was measured. Although the ON resistance is shown to be the same sufficiently low value of 3.2 mΩ cm$^2$, when 880V is applied between the source and drain, the gate oxide film is damaged. From these results, we can see that the semiconductor device of the present disclosure maintains a sufficient breakdown voltage while demonstrating an extremely low ON resistance.

Figure 10:
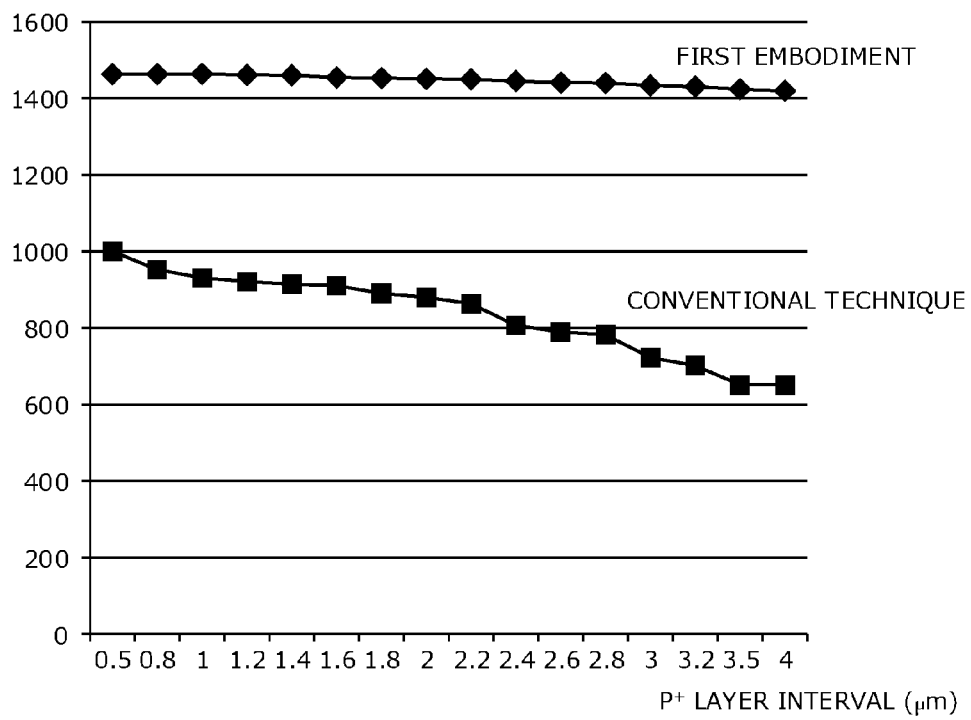
FIG. 10 is a chart of breakdown voltage performance of the SiC-MOSFET according to the first embodiment of the present disclosure.

FIG. 10 is a chart of breakdown voltage performance of the SiC-MOSFET according to the first embodiment of the present disclosure. The vertical axis represents the breakdown voltage (V) and the horizontal axis represents the width of the n counter layer 6, i.e., the $p^+$ layer 3 interval (μm). For comparison, a SiC-MOSFET produced by a conventional technique, without any joining of the $p^+$ layers 3 or formation of the $p^+$ layer 31 is also depicted.

Results of using the concentrations and thicknesses of the layers of the device described above indicate that the first embodiment of the present disclosure realizes high breakdown voltage characteristics of 1400V or higher, which are sufficient breakdown voltage characteristics for a 1200V device. Here, the ON resistance was the same for both conditions. To make the conventional SiC-MOSFET used for comparison satisfy the same high breakdown voltage characteristics of 1400V or higher as the first embodiment, the distance between the $p^+$ layers 3 was set to 1.0 μm or less and the impurity concentration of the n counter layer 6 had to be reduced to ⅕. Here, the ON resistance showed an extremely high value of 12.8 mΩ cm$^2$. In other words, the present disclosure can improve both the ON resistance and breakdown voltage characteristics concurrently.

Meanwhile, Japanese Patent No. 3214274 discloses an example where degradation of breakdown voltage is prevented by connecting adjacent p base layers. Nonetheless, with this method, by partially connecting the p base layers, the surface accumulation layer of the connected portion is eliminated and as a result, the MOSFET of the connected portion does not operate. As a result, the ON resistance becomes high. However, the present disclosure connects the $p^+$ layers 3 and not the p base layers 4, whereby the surface accumulation layer remains and as a result, the ON resistance can be made sufficiently low. To investigate this, a device in which the p base layers 4 were connected and not the $p^+$ layers 3 was produced and the characteristics where evaluated. The breakdown voltage of the device is the same 1440V, however, the ON resistance was 5.0 mΩcm$^2$ and degraded about 50% compared to the present disclosure.

Figure 11:
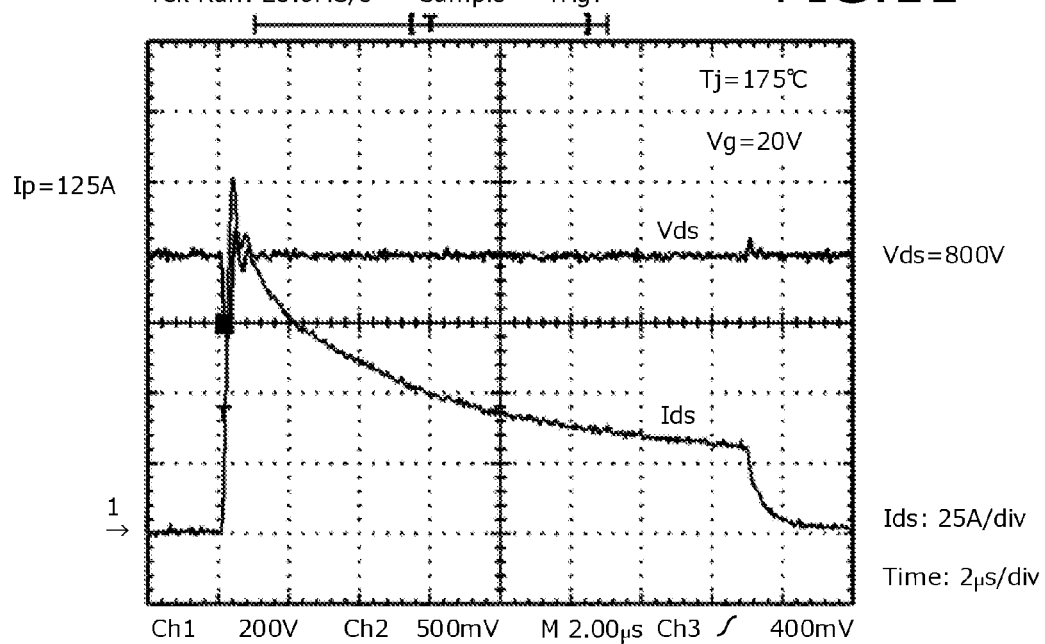
FIG. 11 is a chart of measurement results of short circuit capability of the SiC-MOSFET according to the first embodiment of the present disclosure.

FIG. 11 is a chart of measurement results of short circuit capability of the SiC-MOSFET according to the first embodiment of the present disclosure. In this short circuit capability experiment, power source voltage was directly applied between the source and drain and in this state, voltage Vg=20V was applied to the gate electrode and a failure time (number of μsec that failure does not occur) was evaluated. The horizontal axis represents time and the vertical axis represents current and voltage values, where the power source voltage Vds=800V and the measurement temperature Tj is 175 degrees C. The results further indicate sufficient characteristics where even for 15 μsec, failure does not occur when a maximum current of Ip=125 A, which is 5 times the device rated current, is conducted.

Figure 12:
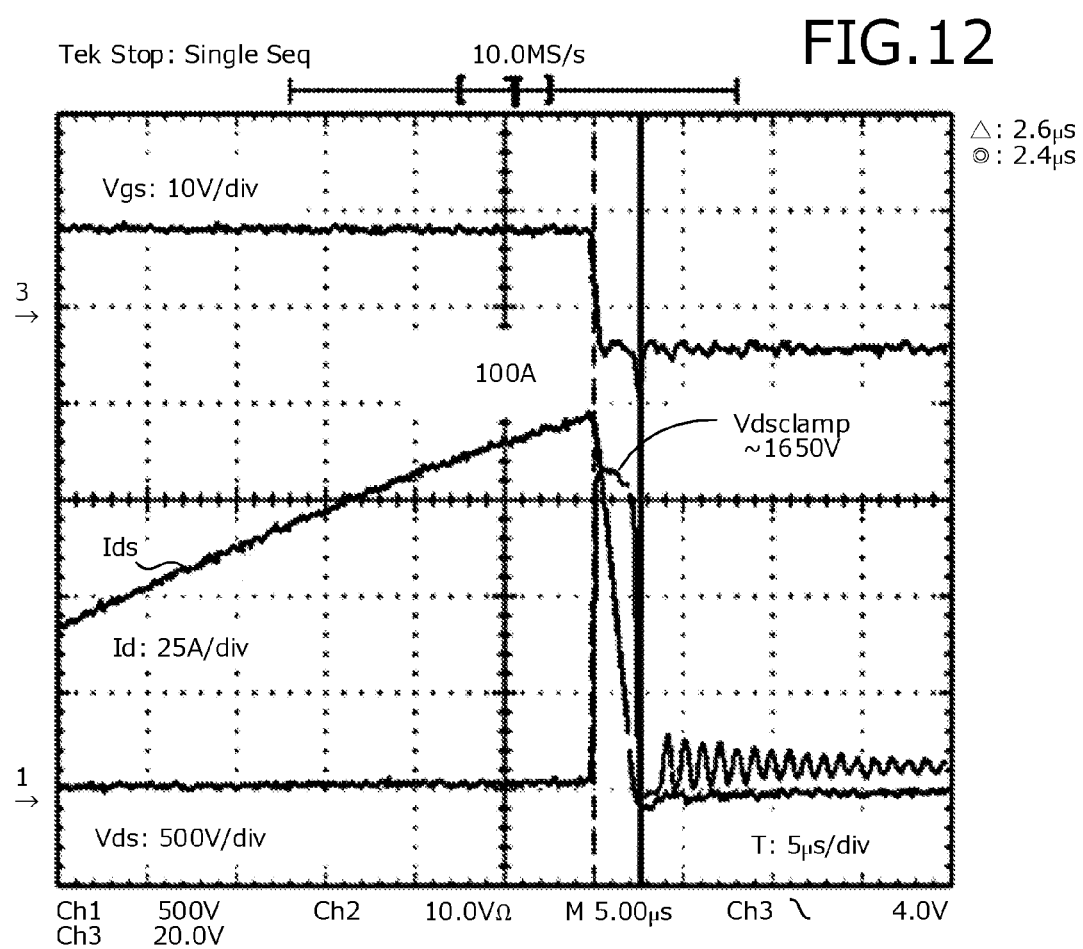
FIG. 12 is a chart of evaluation results for turn-OFF capability of the SiC-MOSFET of the first embodiment according to the present disclosure.

FIG. 12 is a chart of evaluation results for turn-OFF capability of the SiC-MOSFET of the first embodiment according to the present disclosure. The horizontal axis represents time and the vertical axis represents current and voltage values. With the evaluation of turn-OFF capability, it was further confirmed that with voltage between the source and drain clamped at 1650V (Vdsclamp in FIG. 12), 100 A (4 times the rated current) can be turned OFF at 150 degrees C. without device failure. Therefore, the device of the present disclosure realizes low ON resistance and can be a device for which the short circuit capability and turn-OFF capability is extremely high. Further, as the conventional technique columns in FIG. 9 indicate, evaluation of the tolerance of the various types of SiC-MOSFETs produced for comparison results in the breakdown voltage being insufficient whereby, the short circuit capability and the turn-OFF capability compared to the device of the first embodiment greatly degrade.

In device evaluation performed concerning devices produced by similarly forming films on a surface tilted 0 degrees, 2 degrees, 8 degrees, and 10 degrees with respect to a crystallographic plane index (000-1) of the $n^+$-type SiC semiconductor substrate 1 described above, there were substantially no changes in characteristics and evaluation was favorable.

In this manner, in cases where the semiconductor material is silicon carbide, by setting a plane parallel to or within 10 degrees with respect to the crystallographic plane index (000-1) of the $n^+$-type SiC semiconductor substrate 1, or by setting a plane parallel to or within 10 degrees with respect to a crystallographic plane index (0001) of the $n^+$-type SiC semiconductor substrate 1, interface state density of the gate oxide film and semiconductor interface can be reduced, enabling mobility of the MOSFET portion to be further enhanced. As a result, the ON resistance can be made extremely low.

Second Embodiment

Figure 13:
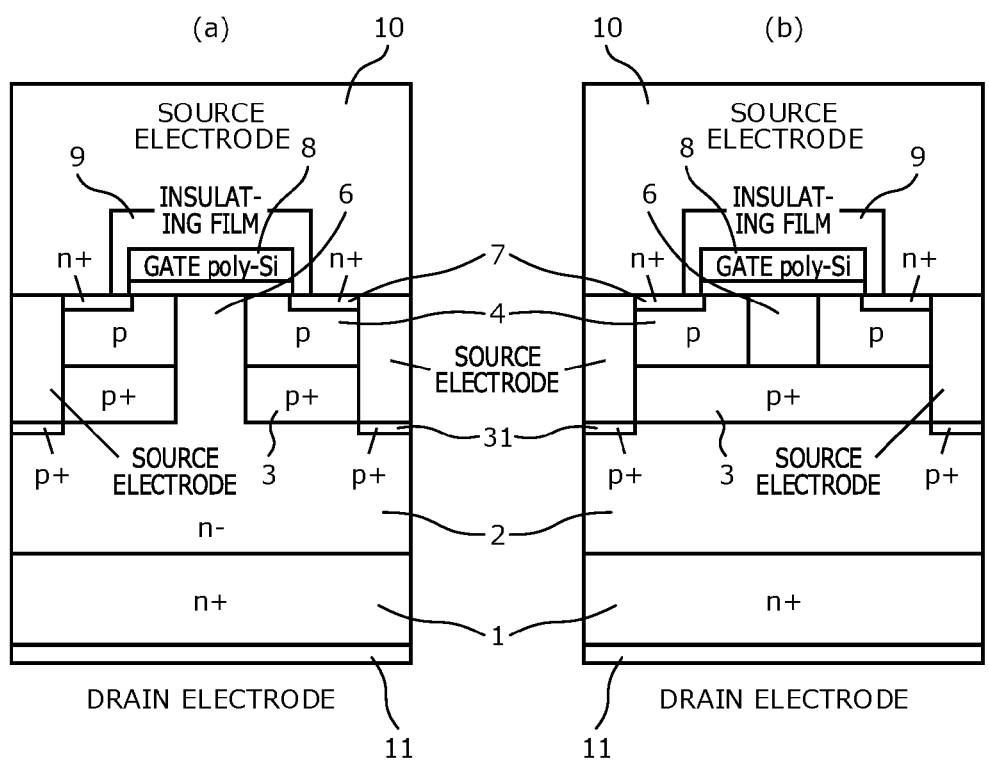
FIG. 13 is a cross-sectional view of the SiC-MOSFET according to a second embodiment of the present disclosure.

FIG. 13 is a cross-sectional view of the SiC-MOSFET according to the second embodiment of the present disclosure. A MOSFET of 1200V and 25 A is produced by the same manufacturing processes as the first embodiment described above. However, in the second embodiment, the formation method of the p$^+$ layer 31 involves digging a trench from the p base layer 4 surface to penetrate the p$^+$ layer 3 and thereafter, forming the p$^+$ layer 31 by ion implantation of aluminum in the n$^-$-type SiC layer 2 at a bottom surface of the trench. Thereafter, the trench is formed to be embedded with metal electrode nickel and aluminum. Evaluation results of the electrical characteristics of the produced device are depicted in FIG. 9. The ON resistance, the short circuit capability, and characteristics equivalent to the first embodiment are demonstrated and thus, are favorable.

Third Embodiment

A third embodiment produces a MOSFET of 1200V and 25 A by the same manufacturing processes as the first embodiment. In the third embodiment, in place of the p$^+$ layer 3, the p base layer 4 is selectively formed in the surface layer of the n$^-$-type SiC layer 2, and the p base layer 4 is further deposited on the p base layer 4 and the n$^-$-type SiC layer 2. Alternatively, in place of the p$^+$ layer 3, the p base layer 4 is formed in the surface layer of the n$^-$-type SiC layer 2 and in the p base layer 4, the n counter layer 6 is formed at a depth that does not penetrate the p base layer 4.

Other processes and the cell structure are identical to those of the first embodiment. Evaluation results of the electrical characteristics of the produced device are depicted in FIG. 9. The ON resistance increases about 10% compared to the first embodiment and compared to a typical SiC-MOSFET, sufficiently favorable low resistance characteristics are demonstrated.

Fourth Embodiment

A fourth embodiment produces a MOSFET of 1200V and 25 A by the same manufacturing processes as the second embodiment. In the fourth embodiment, similar to the third embodiment, in place of the p$^+$ layer 3, the p base layer 4 is selectively formed in the surface layer of the n$^-$-type SiC layer 2, and the p base layer 4 is further deposited on the p base layer 4 and the n$^-$-type SiC layer 2. Alternatively, in place of the p$^+$ layer 3, the p base layer 4 is formed in the surface layer of the n$^-$-type SiC layer 2. The n counter layer 6 is formed in the p base layer 4, at a depth that does not penetrate the p base layer 4.

Other processes and the cell structure are identical to those of the second embodiment. Evaluation results of the electrical characteristics of the produced device are depicted in FIG. 9. The ON resistance increases about 10% compared to the first embodiment and compared to a typical SiC-MOSFET, sufficiently favorable low resistance characteristics are demonstrated.

In the first to fourth embodiments above, films are similarly formed on a surface tilted 0 degrees, 2 degrees, 8 degrees, and 10 degrees with respect to a crystallographic plane index (000-1) or (0001) of the n$^+$-type SiC semiconductor substrate 1 and device evaluation for the produced devices was performed demonstrating substantially no changes in characteristics and favorable evaluation.

Fifth Embodiment

In a fifth embodiment, a p channel MOSFET in which the conductivity type of the impurity varies compared to the first to fourth embodiments is produced and characteristics thereof are evaluated. The fifth embodiment reverses the p-types and the n-types of the first embodiment and the same reference numerals used in the first embodiment are used in the fifth embodiment. The p$^+$-type SiC semiconductor substrate 1 is prepared. Here, the p$^+$-type SiC semiconductor substrate 1 of low resistivity includes about 2×10$^{19}$ cm$^{-3}$ of aluminum as an impurity. On a surface of the p$^+$-type SiC semiconductor substrate 1, tilted about 4 degrees with respect to the crystallographic plane index (0001), the p$^-$-type SiC layer 2 that includes about 1.0×10$^{16}$ cm$^{-3}$ of aluminum is epitaxially grown to about 10 µm. In the surface layer of the p$^-$-type SiC layer 2, the n$^+$ layer 31 of a width of 2 µm and a depth of 0.3 µm is formed by an ion implantation method. Thereafter, acceleration energy is reduced and the n$^+$ layer 3 of a width of 13 µm and a depth of 0.5 µm is formed by an ion implantation method. Here, the ion used is phosphorus. Further, the n$^+$ layer 31 is disposed in a center of the n$^+$ layer 3.

A dosing volume is set such that the impurity concentration of the n$^+$ layer 31 and the n$^+$ layer 3 becomes 1.0×10$^{18}$ cm$^{-3}$. Here, below the p counter layer 6 formed at a later process, a portion of the n$^+$ layers 3 are mutually joined by the joining unit 13 (refer to FIGS. 8A and 8B). In the fifth embodiment, although produced in a hexagonal cell pattern, the n$^+$ layers 3 may be another polygonal shape such as a quadrilateral cell, etc. Further, the distance between the n$^+$ layers 3 of portions not joined is 2 µm.

Thereafter, the n base layer 4 of a thickness of 0.5 µm is formed by an epitaxial growth method on the n$^+$ layer 3 and the p$^-$-type SiC layer 2. Here, the impurity is nitrogen and the impurity concentration is set to become 5.0×10$^{16}$ cm$^{-3}$. Thereafter, 5.0×10$^{16}$=$^{-3}$ of aluminum ions are selectively implanted by ion implantation to a depth of 1.5 µm and a width of 2.0 µm to be the p counter layer 6, which counters a portion of the n base layer 4 by the p-type, and a p$^+$ source layer and an n$^+$ contact layer are selectively formed inside the n base layer. Thereafter, activation annealing is performed. The heat treatment temperature and duration are 1800 degrees C. and 2 minutes.

Thereafter, the gate oxide film of a thickness of 100 nm is formed by thermal oxidation and annealing is performed in a hydrogen atmosphere around 1000 degrees C. The polycrystalline silicon layer doped with phosphorus is formed as the gate electrode 8 and after patterning is performed, a film of phosphorous glass of thickness of 1.0 µm is formed as the interlayer insulating film 9, and patterning and heat treatment are performed. A film of aluminum including 1% silicon and having a thickness of 5 µm is formed on the surface by a sputtering method and the source electrode 10 is formed. A nickel film is formed on the device back surface and after heat treatment at 970 degrees C., the back surface electrode 11 is formed by stacked layers of Ti/Ni/Au. The protection film is added to the surface on the source electrode 10 side, completing manufacture of the device.

Measurement results of electrical characteristics of the p channel SiC-MOSFET of the fifth embodiment produced in this manner are depicted in FIG. 9. The chip size is 3 mm square; the area of the active region is 5.27=$^2$; and the rated current is 25 A. The ON resistance (RonA) is indicated to be a sufficiently low value of 5.2 mΩ cm$^2$ and the initial breakdown voltage is a −1430V and is also indicated to be a sufficiently characteristic for 1200V device. For comparison, a SiC-MOSFET produced without any joining of the n$^+$ layers 3 was measured. Although the ON resistance is shown to be the same sufficiently low value of 5.2 mΩ cm$^2$, when 700V is applied between the source and drain, the gate oxide film is damaged. Thus, we can see that the semiconductor device of the present disclosure maintains sufficient breakdown voltage while demonstrating an extremely low ON resistance.

Sixth Embodiment

A sixth embodiment produces a MOSFET of 1200V and 25 A by the same manufacturing processes as the fifth embodiment. In the sixth embodiment, the formation method of the n$^+$ layer 31 involves digging a trench from the n base layer 4 surface to penetrate the n$^+$ layer 3; and implanting nitrogen or phosphorus in the p$^-$-type SiC layer 2 at the bottom surface of the trench. Thereafter, the trench is formed to be embedded with a metal electrode (nickel and aluminum). A cross-sectional structural view is the same as that of FIG. 13 where the conductivity types of the impurities are reversed. Evaluation results of the electrical characteristics of the produced device are depicted in FIG. 9. The ON resistance and the short circuit capability, and characteristics equivalent to the fifth embodiment are demonstrated and thus, are favorable.

Seventh Embodiment

A seventh embodiment produces a MOSFET of 1200V and 25 A by the same manufacturing processes as the fifth embodiment. In the seventh embodiment, similar to the third embodiment, the n base layer 4 is formed by an ion implantation method without forming the n$^+$ layer 3. Other processes and the cell structure are identical to those of the fifth embodiment. Evaluation results of the electrical characteristics of the produced device are depicted in FIG. 9. The ON resistance increases about 15% compared to the fifth embodiment and compared to a typical SiC-MOSFET, sufficiently favorable low resistance characteristics are demonstrated.

Eighth Embodiment

An eighth embodiment produces a MOSFET of 1200V and 25 A by the same manufacturing processes as the sixth embodiment. In the eighth embodiment, similar to the third embodiment, the n base layer 4 is formed by an ion implantation method without forming the n$^+$ layer 3. Other processes and the cell structure are identical to those of the sixth embodiment. Evaluation results of the electrical characteristics of the produced device are depicted in FIG. 9. The ON resistance increases about 15% compared to the fifth embodiment and compared to a typical SiC-MOSFET, sufficiently favorable low resistance characteristics are demonstrated.

In the fifth to eighth embodiments, films are similarly formed on a surface tilted 0 degrees, 2 degrees, 8 degrees, and 10 degrees with respect to a crystallographic plane index (000-1) or (0001) of the p$^+$-type SiC semiconductor substrate 1 and device evaluation of the produced devices was performed demonstrating substantially no changes in characteristics and favorable evaluation.

Ninth Embodiment

Figure 14:
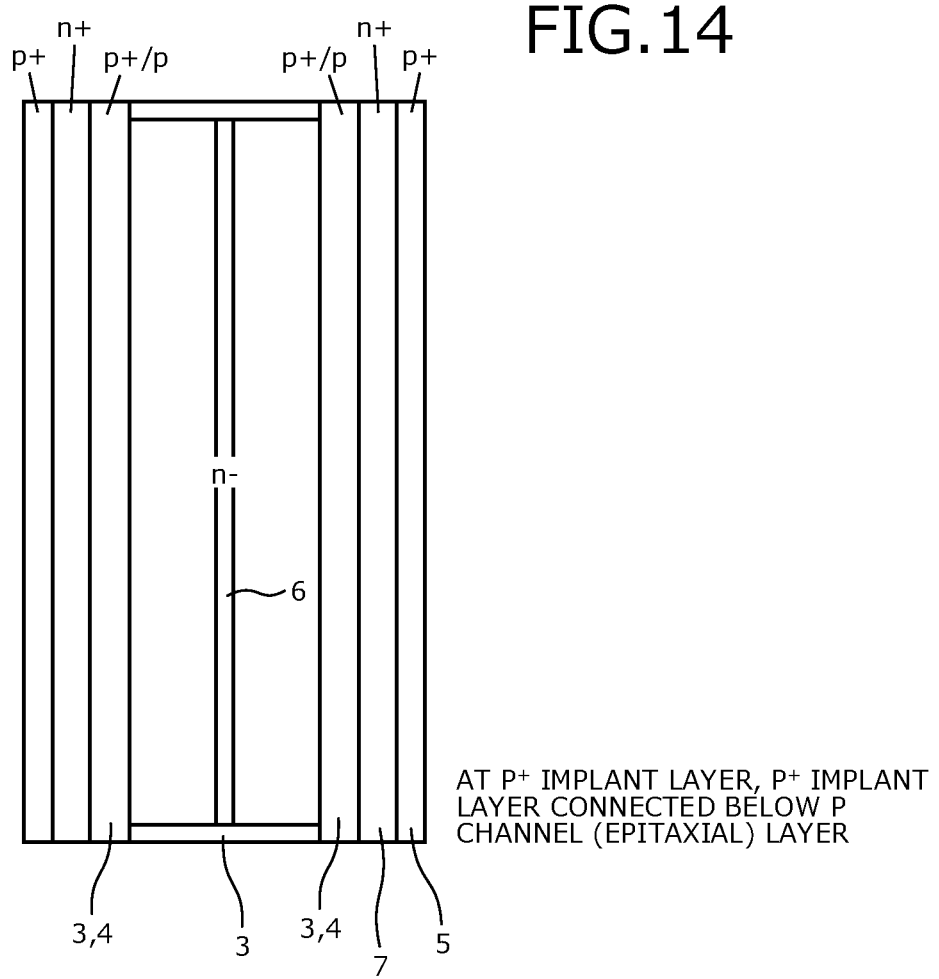
FIG. 14 is a plan view of p$^+$ layer and cell layout of the SiC-MOSFET according to a ninth embodiment of the present disclosure.

FIG. 14 is a plan view of p$^+$ layer and cell arrangement of the SiC-MOSFET according to the ninth embodiment of the present disclosure. The ninth embodiment produces a MOSFET of 1200V and 25 A by the same manufacturing processes as the first and second embodiments. In the ninth embodiment, the MOSFET is designed by a stripe cell pattern. Therefore, arrangement of the p$^+$ layers 3 joins the p$^+$ layers 3 by the structure depicted in FIG. 14. Other processes are identical to those of the first and second embodiments. Evaluation results of the electrical characteristics of the produced device are depicted in FIG. 9. The ON resistance increases about 10% compared to the first embodiment and other characteristics substantially do not degrade, demonstrating sufficiently low ON resistance characteristics and high breakdown voltage compared to a typical SiC-MOSFET.

Tenth Embodiment

A tenth embodiment produces a MOSFET of 1200V and 25 A by the same manufacturing processes as the fifth and sixth embodiments. In the tenth embodiment, the MOSFET is designed by a stripe cell pattern. Therefore, arrangement of the n$^+$ layers 3 joins the n$^+$ layers 3 by the same structure as that depicted in FIG. 14. Other processes are identical to those of the fifth and sixth embodiments. Evaluation results of the electrical characteristics of the produced device are depicted in FIG. 9. The ON resistance increases about 20% compared to the fifth and sixth embodiments and other characteristics substantially do not degrade, demonstrating sufficiently low ON resistance characteristics and high breakdown voltage compared to a typical SiC-MOSFET.

Figure 15:
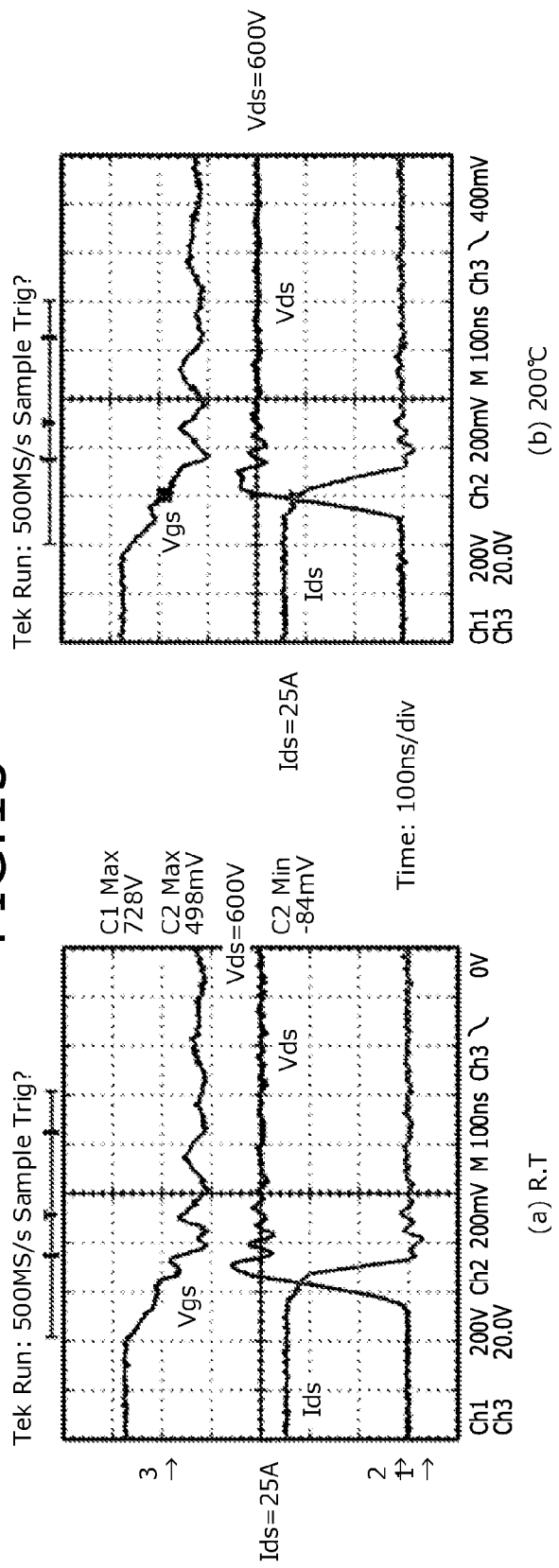
FIG. 15 depicts turn-OFF switching waveforms of the SiC-MOSFET of the embodiments of the present disclosure.
Figure 16:
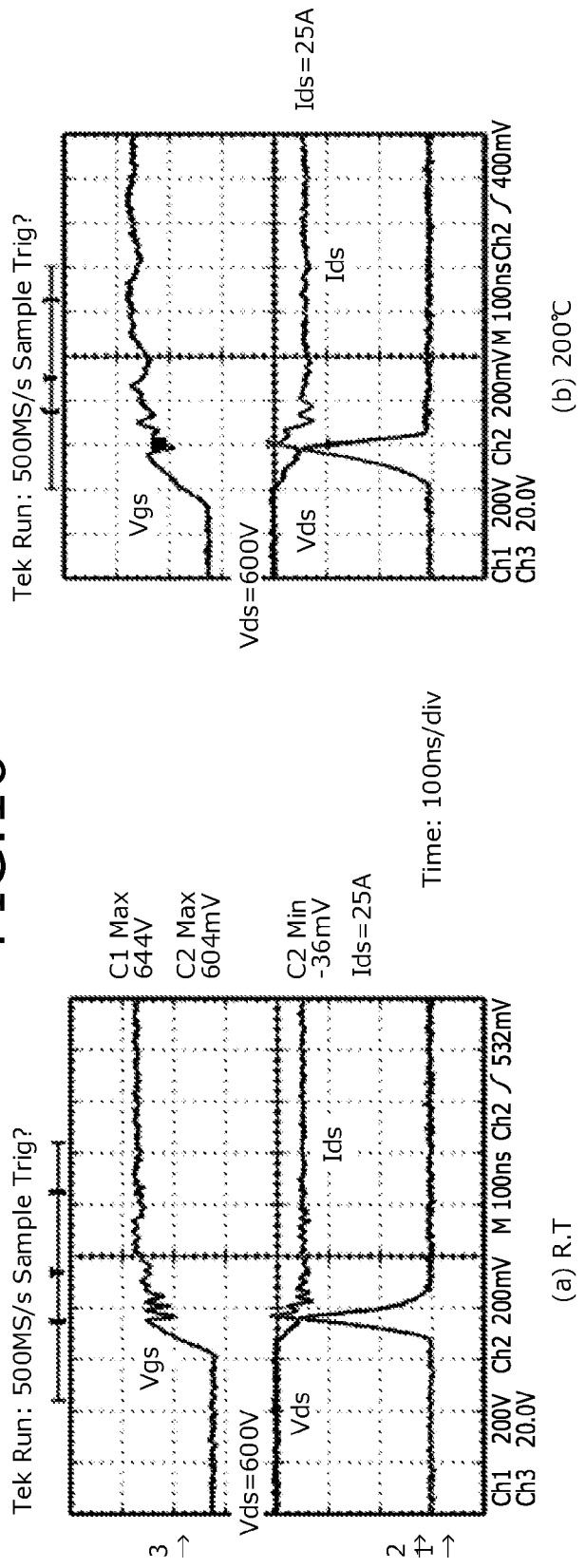
FIG. 16 depicts turn-ON switching waveforms of the SiC-MOSFET of the embodiments of the present disclosure.
Figure 17:
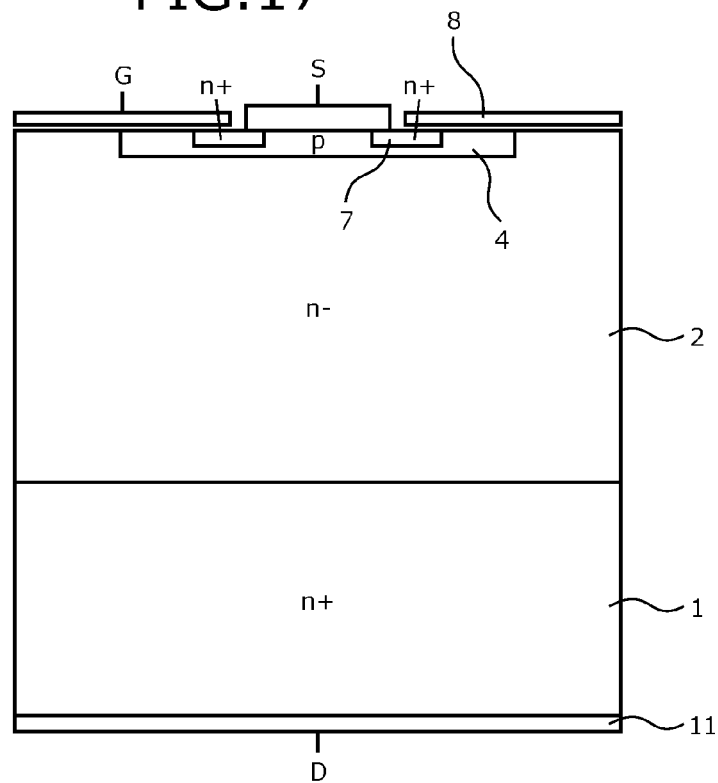
FIG. 17 is a cross-sectional view of a conventional MOSFET.
Figure 18:
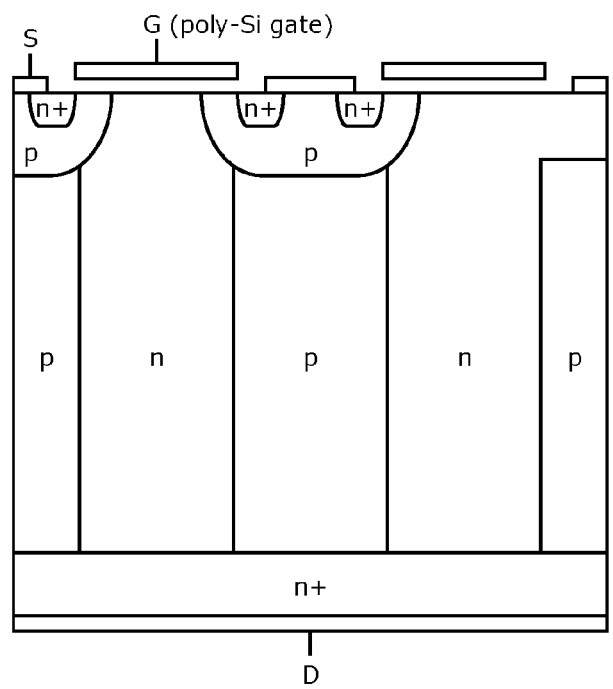
FIG. 18 is a cross-sectional view of a conventional silicon superjunction MOSFET.
Figure 19:
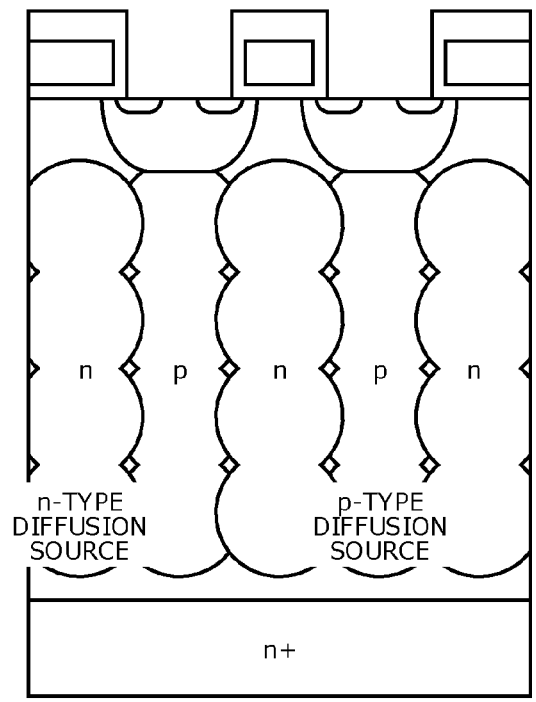
FIG. 19 is a cross-sectional view of a silicon superjunction MOSFET by a conventional multi epitaxial growth method.
Figure 20:
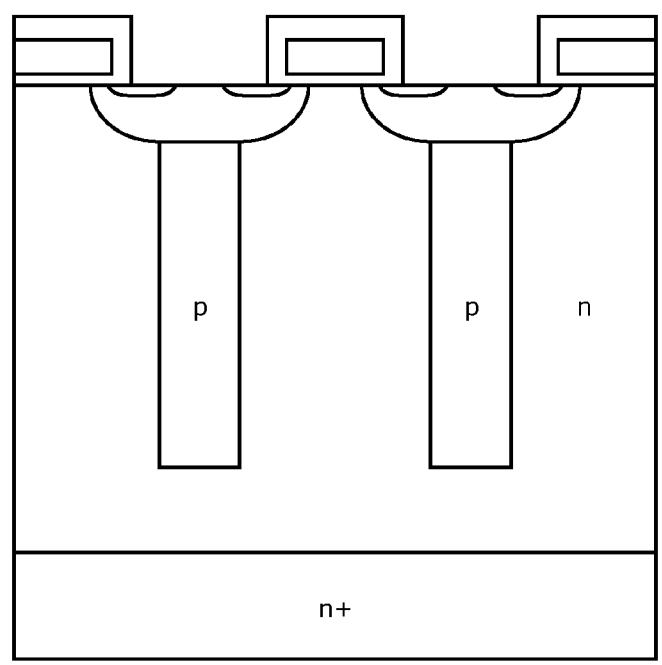
FIG. 20 is a cross-sectional view of a silicon superjunction MOSFET by a conventional trench filling method.

FIG. 15 depicts turn-OFF switching waveforms of the SiC-MOSFET of the embodiments of the present disclosure. FIG. 16 depicts turn-ON switching waveforms of the SiC-MOSFET of the embodiments of the present disclosure. In the drawings, (a) is for room temperature and (b) is for a temperature environment of 200 degrees C.; the horizontal axis represents time; and the vertical axis represents voltage and current. Switching loss evaluation of the SiC-MOSFETs produced by the first to tenth embodiments confirms that a 60% or greater reduction is facilitated for the turn-OFF loss depicted in FIG. 15 and the turn-ON loss depicted in FIG. 16, for the same rated Si-IGBT (1200V, 25 A).

Further, the present disclosure is applicable to a conductivity type semiconductor substrate different from a MOSFET. In the case of an IGBT, in the first to fourth and ninth embodiments, the conductivity type of the n$^+$-type SiC semiconductor substrate 1 suffices to be the p-type and in the fifth to eighth and tenth embodiments, the conductivity type of the p$^+$-type SiC semiconductor substrate 1 suffices to be the n-type.

The material performance of SiC is likely to exceed the material performance limits of silicon and therefore, increased use of SiC for power semiconductors is greatly expected, especially for MOSFETs. Although the SiC, in particular, is expected to have a low ON resistance, according to the embodiments described above, a vertical SiC-MOSFET, IGBT structure and a simple manufacturing method thereof can be provided that enable a low ON resistance without degrading reliability while enabling damage of the semiconductor itself and damage of the gate oxide film to be prevented even when high voltage is applied.

Further, according to the embodiments of the present disclosure, a MOSFET and an IGBT can be provided that while maintaining sufficient breakdown voltage without dependency on crystal plane orientation of the substrate, further enable high speed switching to be obtained in addition to a high breakdown tolerance with a low ON resistance.

According to the configuration above, even when the impurity concentration of the first conductivity type semiconductor layer and the first conductivity type well region is greatly increased and the ON resistance is sufficiently lowered, and even when irrespective of a high electric field at the gate oxide film on the n-type semiconductor cell region (n counter layer), high voltage is applied between the source and drain (0V is applied to the source and +voltage is applied to the drain), sufficient breakdown voltage can be maintained. Further, even when the distance between the second conductivity type high-concentration semiconductor layers and between the second conductivity type low-concentration semiconductor layers is increased and the ON resistance is sufficiently lowered, irrespective of a high electric field at the gate oxide film on the first conductivity type well region, sufficient breakdown voltage can be maintained.

Further, even in a state where high voltage, high current, etc. under load short circuit conditions are concurrently applied to/conducted by the device, electric field strength is mitigated and therefore, high breakdown tolerance can be shown. This is consequent to a depletion layer that spreads from the pn junction between the second conductivity type low-concentration semiconductor layer and the second conductivity type high-concentration semiconductor layer and the first conductivity type well region, to the first conductivity type well region, being susceptible to spreading along the second conductivity type high-concentration semiconductor layer in a horizontal direction. As a result, even when the impurity concentration of the first conductivity type low-concentration semiconductor layer and the first conductivity type well region is set higher than that of a conventional MOSFET, the design facilitates spreading of the depletion layer and therefore, the distance between the second conductivity type high-concentration semiconductor layers and between the second conductivity type low-concentration semiconductor layers increases, enabling the breakdown voltage and the breakdown tolerance to be sufficiently held and the ON resistance to be reduced.

When the second conductivity type low-concentration semiconductor layer is formed by an epitaxial growth method, a flat surface with substantially no surface roughness can be achieved and therefore, the mobility of the MOSFET portion of the surface becomes extremely large and as a result, the ON resistance can be further reduced.

In a case where the material of the first conductivity type semiconductor substrate is silicon carbide, by setting the crystallographic plane index of the first conductivity type semiconductor substrate to be parallel to or within 10 degrees of (000-1), or the crystallographic plane index of the first conductivity type semiconductor substrate to be parallel to or within 10 degrees of (0001), the interface state density of the gate oxide film and the semiconductor interface can be reduced, enabling enhancement of the mobility of the MOSFET portion. As a result, the ON resistance can be made extremely low.

According to the present disclosure, an effect can be achieved in that high breakdown tolerance with low ON resistance and high switching can be obtained.

As described, the high voltage semiconductor device and the manufacturing method thereof according to the present disclosure, for example, are useful for power semiconductor devices used for industrial motor control and engine control, and power semiconductor apparatuses such as power devices.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A high voltage semiconductor device, comprising a plurality of cells having a common semiconductor substrate of a first conductivity type, each cell further comprising:
   a first semiconductor layer of the first conductivity type formed on the semiconductor substrate and having an impurity concentration that is lower than that of the semiconductor substrate;
   a second conductivity type region provided selectively in a surface of the first semiconductor layer;
   a second semiconductor layer of a second conductivity type provided on the second conductivity type region and provided selectively in the surface of the first semiconductor layer, the second semiconductor layer having a width that is larger than that of the second conductivity type region;
   a third semiconductor layer of the second conductivity type formed on the first semiconductor layer and the second semiconductor layer, and having an impurity concentration that is lower than those of the second conductivity type region and the second semiconductor layer;
   a source region of the first conductivity type selectively formed in a surface layer of the third semiconductor layer;
   a well region of the first conductivity type formed from a surface of the third semiconductor layer and penetrating the third semiconductor layer to reach the first semiconductor layer;
   a gate electrode layer disposed via a gate insulating film, on an exposed surface portion of the third semiconductor layer between the source region and the well region;
   a source electrode that contacts the source region and the third semiconductor layer; and
   a drain electrode disposed in a back surface of the first semiconductor substrate,
   wherein the high breakdown voltage semiconductor device is a vertical type, and
   wherein the second semiconductor layer of each cell is partially joined to the second semiconductor layer of at least one adjacent one of the cells at respective areas of the well regions on sides thereof near the drain electrodes, and
   wherein the third semiconductor layer of each cell is not joined to the third semiconductor layer of at least one adjacent one of the cells over respective areas where the second semiconductor layer of each cell is partially joined to the second semiconductor layer of the at least one adjacent one of the cells.

2. The high voltage semiconductor device according to claim 1, wherein each cell further comprises a trench that penetrates the second and third semiconductor layers from a front surface side of the third semiconductor layer and reaches the second conductivity type region, wherein the source electrode is disposed to be embedded inside the trench.

3. The high voltage semiconductor device according to claim 1, wherein the semiconductor substrate is comprised of silicon carbide.

4. The high voltage semiconductor device according to claim 1, wherein the semiconductor substrate has a crystallographic plane index that is a plane that is tilted more than 0 degree and within 10 degrees with respect to (000-1).

5. The high voltage semiconductor device according to claim 1, wherein the semiconductor substrate has a crystallographic plane index that is a plane that is tilted more than 0 degree and within 10 degrees with respect to (0001).

6. A high voltage semiconductor device, comprising a plurality of cells having a common semiconductor substrate of a first conductivity type, each cell further comprising:
   a first semiconductor layer of the first conductivity type formed on the semiconductor substrate and having an impurity concentration that is lower than that of the semiconductor substrate;
   a second semiconductor layer of a second conductivity type provided selectively in a surface of the first semiconductor layer;
   a third semiconductor layer of the second conductivity type formed on the first semiconductor layer and the second semiconductor layer, and having an impurity concentration that is lower than that of the second semiconductor layer, the third semiconductor layer being a base layer;
   a source region of the first conductivity type selectively formed in a surface layer of the third semiconductor layer;
   a well region of the first conductivity type formed from a surface of the third semiconductor layer and penetrating the third semiconductor layer to reach the first semiconductor layer;
   a gate electrode layer disposed via a gate insulating film, on an exposed surface portion of the third semiconductor layer between the source region and the well region;
   a source electrode that contacts the source region and the third semiconductor layer; and
   a drain electrode disposed in a back surface of the first semiconductor substrate,
   wherein the high breakdown voltage semiconductor device is a vertical type,
   wherein the second semiconductor layer of each cell is partially joined to the second semiconductor layer of at least one adjacent one of the cells at respective areas of the well regions on sides thereof near the drain electrodes, and
   wherein the third semiconductor layer of each cell is not joined to the third semiconductor layer of at least one adjacent one of the cells over respective areas where the second semiconductor layer of each cell is partially joined to the second semiconductor layer of the at least one adjacent one of the cells.

7. The high voltage semiconductor device according to claim 6, wherein the third semiconductor layer of each cell is isolated from the third semiconductor layer of at least one adjacent one of the cells over respective areas where the second semiconductor layer of each cell is partially joined to the second semiconductor layer of the at least one adjacent one of the cells.

8. The high voltage semiconductor device according to claim 7, further comprising a second conductivity type region provided selectively in the surface of the first semiconductor layer, and
   wherein the second semiconductor layer is provided on the second conductivity type region.

9. The high voltage semiconductor device according to claim 6, further comprising a second conductivity type region provided selectively in the surface of the first semiconductor layer, and
   wherein the second semiconductor layer is provided on the second conductivity type region.

10. The high voltage semiconductor device according to claim 6,
    wherein each cell further comprises a trench that penetrates the second and third semiconductor layers from a front surface side of the third semiconductor layer, and
    wherein the source electrode is disposed to be embedded inside the trench.

11. The high voltage semiconductor device according to claim 6, wherein the semiconductor substrate is comprised of silicon carbide.

12. A high voltage semiconductor device, comprising a plurality of cells having a common semiconductor substrate of a first conductivity type, each cell further comprising:
    a first semiconductor layer of the first conductivity type formed on the semiconductor substrate and having an impurity concentration that is lower than that of the semiconductor substrate;
    a second conductivity type layer provided selectively in a surface of the first semiconductor layer;
    a second semiconductor layer of a second conductivity type provided on the second conductivity type layer and provided selectively in the surface of the first semiconductor layer, the second semiconductor layer having a width that is larger than that of the second conductivity type layer and having a depth that is less than that of the second conductivity type layer so that the second semiconductor layer and the second conductivity type layer together form an inverted L-shape in the surface of the first semiconductor layer;
    a third semiconductor layer of the second conductivity type formed on the first semiconductor layer and the second semiconductor layer, and having an impurity concentration that is lower than those of the second conductivity type layer and the second semiconductor layer;
    a source region of the first conductivity type selectively formed in a surface layer of the third semiconductor layer;
    a well region of the first conductivity type formed from a surface of the third semiconductor layer and penetrating the third semiconductor layer to reach the first semiconductor layer;
    a gate electrode layer disposed via a gate insulating film, on an exposed surface portion of the third semiconductor layer between the source region and the well region;
    a source electrode that contacts the source region and the third semiconductor layer; and
    a drain electrode disposed in a back surface of the first semiconductor substrate,
    wherein the high breakdown voltage semiconductor device is a vertical type, and
    wherein the second semiconductor layer of each cell is partially joined to the second semiconductor layer of at least one adjacent one of the cells at respective areas of the well regions on sides thereof near the drain electrodes.

13. The high voltage semiconductor device according to claim 12, wherein each cell further comprises a trench that penetrates the second and third semiconductor layers from a front surface side of the third semiconductor layer and reaches the second conductivity type layer, wherein the source electrode is disposed to be embedded inside the trench.

14. The high voltage semiconductor device according to claim 12, wherein the semiconductor substrate is comprised of silicon carbide.

15. The high voltage semiconductor device according to claim 12, wherein the semiconductor substrate has a crystallographic plane index that is a plane that is tilted more than 0 degree and within 10 degrees with respect to (000-1).

16. The high voltage semiconductor device according to claim 12, wherein the semiconductor substrate has a crystallographic plane index that is a plane that is tilted more than 0 degree and within 10 degrees with respect to (0001).

17. The high voltage semiconductor device according to claim 12, wherein the third semiconductor layer of each cell is not joined to the third semiconductor layer of at least one adjacent one of the cells over respective areas where the second semiconductor layer of each cell is partially joined to the second semiconductor layer of the at least one adjacent one of the cells.

* * * * *